United States Patent [19]

Webb

[11] Patent Number: 5,350,488

[45] Date of Patent: Sep. 27, 1994

[54] PROCESS FOR ETCHING HIGH COPPER CONTENT ALUMINUM FILMS

[75] Inventor: Elaine A. Webb, Milpitas, Calif.

[73] Assignee: Applied Materials, Inc., Santa Clara, Calif.

[21] Appl. No.: 988,661

[22] Filed: Dec. 10, 1992

[51] Int. Cl.$^5$ ............................................. C23F 1/12
[52] U.S. Cl. .................................. 156/643; 156/646; 156/656; 437/245
[58] Field of Search .................. 156/643, 646, 656; 437/245, 198

[56] References Cited

U.S. PATENT DOCUMENTS

| | | | |
|---|---|---|---|
| 4,370,196 | 1/1983 | Vossen, Jr. et al. | 156/643 |
| 4,798,650 | 1/1989 | Nakamura et al. | 156/643 |
| 4,951,601 | 8/1990 | Mayden et al. | 118/719 |
| 4,985,113 | 1/1991 | Fujimoto et al. | 156/643 |

Primary Examiner—T. N. Quach
Attorney, Agent, or Firm—Birgit E. Morris

[57] ABSTRACT

Aluminum alloys containing high amounts of copper can be etched to eliminate copper residues using boron trichloride and chlorine under etch conditions of low temperature, low pressure, high power and strict control of the amount of nitrogen present.

9 Claims, 3 Drawing Sheets

PROCESS FOR ETCHING HIGH COPPER CONTENT ALUMINUM FILMS

This invention relates to an improved etching process for aluminum alloys. More particularly, this invention relates to an improved etching process for copper-containing aluminum alloys for integrated circuits.

BACKGROUND OF THE INVENTION

Aluminum lines have long been used to connect transistors of integrated circuits. As the size of transistors has decreased, the area of the cross section of aluminum lines has also decreased.

To make aluminum lines, aluminum or an aluminum alloy is sputter deposited onto a substrate as a thin layer. A photoresist is deposited thereover and patterned, and the uncovered aluminum layer etched away.

In order to ensure good pattern definition and good linewidth integrity, the etch process must be carried out so that the aluminum lines are etched anisotropically, forming vertical or slightly tapered sidewalls so as to maintain the cross section of the aluminum lines at the predetermined width and position.

Present day devices and research contemplates design rules of as little 0.50 micron in width for aluminum lines. However, for these smaller cross section aluminum lines, in the course of further processing of the devices an effect called electromigration has been noted. When a high current density is applied to a device, the aluminum lines begin to form voids in a process described as electromigration, so much so that separation of aluminum contact pads and lines has occurred, rendering the circuit useless.

It is also known to add a small amount, e.g., 0.5–1% by weight, of copper to the aluminum to reduce the electromigration effect. The use of higher copper content aluminum alloys, containing up to as much as about 4% by weight of copper, is currently being used. However, for high copper content aluminum, after standard etch processing in a single substrate etcher to form conductive lines from an aluminum layer, it has been noted that a residue remains on the etched surface, which residue has been determined to be copper. Since copper is a highly conductive metal, if the copper residue contacts an aluminum line, a short can result.

Aluminum lines deposited onto a silicon substrate are generally made up of a series of layers; a layer of sputter deposited aluminum or aluminum alloy, and a layer of, for example, TiN, TiW or W over and/or under the aluminum. Thus the etch process to form the aluminum lines is usually a multi-step etch to etch through these layers. A silicon oxide layer to be used as a hard mask can also be present over the metal layers.

A present etch process that has been used for etching aluminum comprises reactive ion etching in a single substrate etcher with a precursor gas mixture comprising; $Cl_2$, from 10 to 80%; $BCl_3$, from 0 to 80%; $CF_4$, from 0 to 50%; and nitrogen, from 0 to 50%; under etch conditions of about 10–350 millitorr pressure; 200 to 1000 Watts power for the support electrode; and temperature of about 60° to 100° C. This process, while effective to etch aluminum or aluminum/silicon alloys containing up to about 0.5% by weight of copper, leaves a copper residue on the substrate when higher copper content aluminum alloys are used in the single substrate processing chamber.

FIG. 1 is a photomicrograph of etched aluminum lines using the above prior art process, the aluminum containing 2% by weight of copper. The copper residue can be clearly seen on the surface of the substrate.

FIG. 2 is a photomicrograph of a cross sectional view of the same etched aluminum line wherein the copper residue is seen on the surface of the substrate.

Thus a process that will etch copper-containing aluminum alloys that maintains vertical or slightly tapered aluminum sidewalls but without leaving a copper residue on the substrate would be highly desirable.

SUMMARY OF THE INVENTION

I have found that high copper-containing aluminum alloys can be reactive ion etched in a single wafer etch chamber in a highly anisotropic manner using a precursor gas containing principally chlorine or chlorine and boron trichloride mixtures and without leaving a copper residue, by maintaining certain etch conditions during the etch process; the etch temperature and pressure must be kept at a low level during etching, a high power/high bias to the support cathode must be maintained during etching, and nitrogen gas levels in the etch precursor gas stream must be strictly controlled.

DETAILED DESCRIPTION OF THE INVENTION

Figure 1:
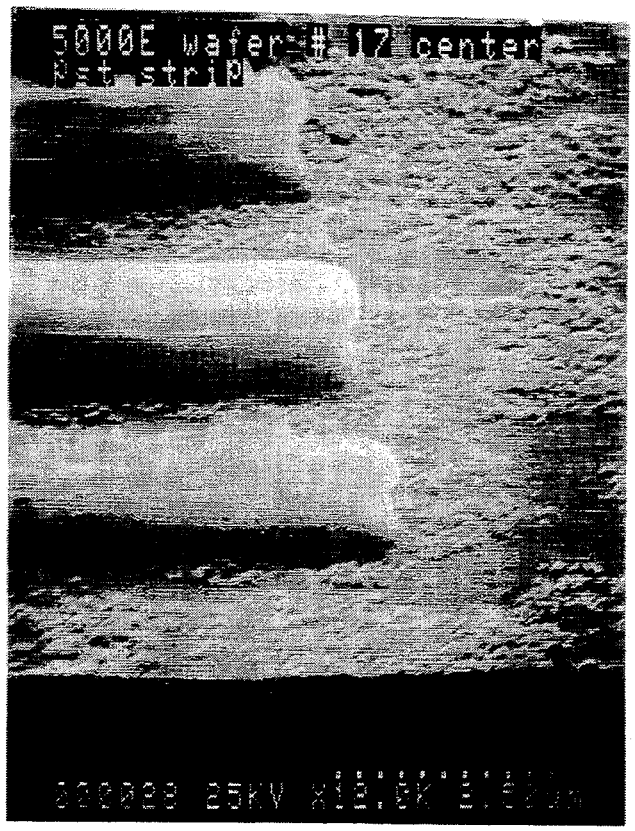
FIG. 1 is a photomicrograph of etched high copper content aluminum lines using a prior art etching process.

The present etch process for high copper content aluminum alloys comprises reactive ion etching using a precursor etch gas principally containing boron trichloride and chlorine. The amount of additional gases, such as nitrogen, that is used in the precursor gas stream must be strictly controlled and, as the copper content of the aluminum alloy to be etched increases, the amount of the nitrogen gas used should be deceased or eliminated altogether. A low pressure should be maintained during etching of the high copper concentration aluminum, e.g., below about 80 millitorr, preferably in the range of about 10–15 millitorr; a low temperature should be maintained during etching, e.g., below about 80° C., preferably in the range of about 60°–65° C.; and high power levels and bias to the electrode support for the substrate should also be maintained in order to remove the copper nodules on the substrate.

The semiconductor industry has moved in recent years from batch processing to single substrate processing, primarily because larger substrates have become available so that more devices can be formed at the same time in a single substrate, and because, as devices have become smaller, the problems of process control and particulate formation in conventional batch processing have been exacerbated. Conventional batch processing transfers a batch of wafers from one processing chamber to another, and in the course of the transfer, particles are formed and deposit onto the substrate from the atmosphere, which particles adversely impact the yield of good devices. Further, if there is an equipment failure during any processing step, many substrates are lost rather than just one.

Maydan in U.S. Pat. No. 4,951,601 describes a vacuum system in which a plurality of single substrate vacuum processing chambers are joined to a transfer chamber having a robot that can transfer substrates from one processing chamber to another without ever leaving a vacuum environment. This system greatly reduces the generation of particles that can contaminate a substrate. The use of such a vacuum system is contemplated in the present process for sequential processing to remove a hardmask of silicon oxide carried out in one chamber, etching of TiN, TiW, W and aluminum alloy in the same or separate RIE chambers, and a photoresist strip which takes place in still another chamber. Such equipment includes the Precision 5000 series vacuum systems of Applied Materials, Inc, of Santa Clara, Calif., the assignor of the present invention. These vacuum systems comprise various chambers connected to a central robot transfer chamber. Wafers can be cleaned, processed in various chambers include etch chambers, deposition chambers, preclean chambers and the like, in any preselected order, all without having to transfer the wafer out of a vacuum environment.

Etching of aluminum lines is carried out by reactive ion etching an aluminum layer having a patterned layer of photoresist thereon using a reactive precursor gas that is passed between two electrodes to form a plasma. The plasma reacts with the exposed portion of the aluminum, etching away the aluminum and forming volatile by-products which are pumped away. However, copper by-products of the reaction are far less volatile than aluminum by-products at the temperatures of reaction and thus a copper residue remains on the surface of the etched wafer when the copper content of the aluminum alloy rises above about 0.5% by weight.

Figure 3A:
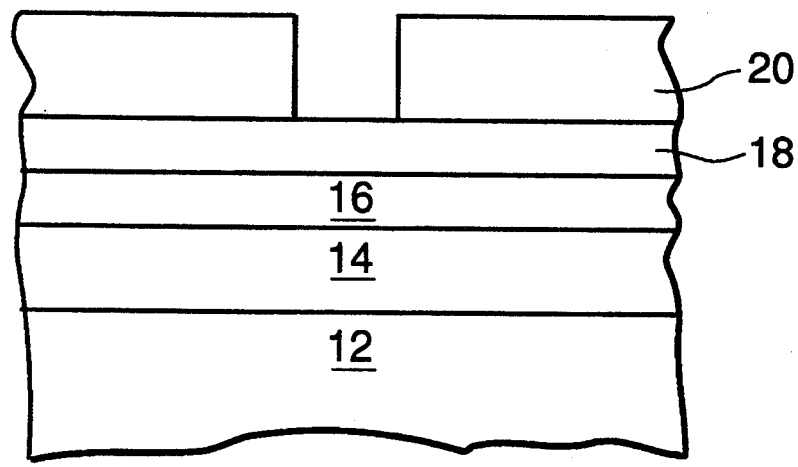
FIG. 3A is a cross sectional view of a stacked aluminum line to be processed in accordance with the invention.
Figure 3B:
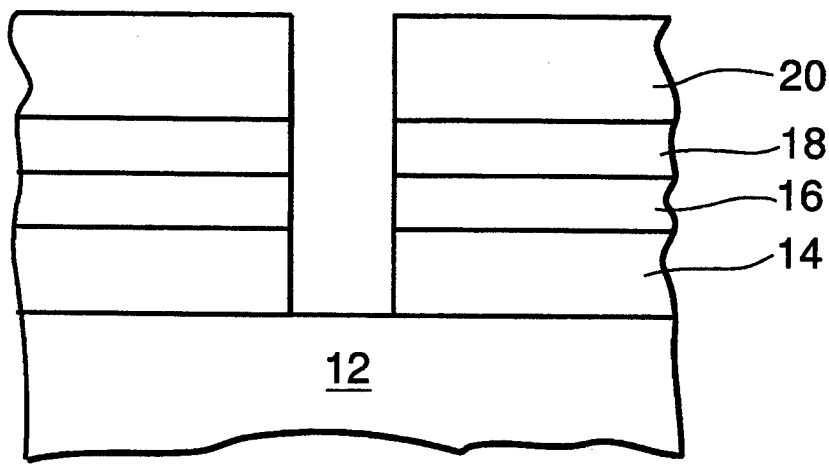
FIG. 3B is a cross sectional view of a stacked aluminum line that is processed in accordance with the invention.

Using a Precision 5000 etch system of Applied Materials Inc, a four step etch process can be used to pattern etch multi-stack thin films as in FIG. 3A. Referring to FIG. 3A, the multi-layer film stack 10 comprises a substrate 12 which can be a silicon wafer or a silicon oxide layer; a high copper content aluminum alloy layer 14; a TiN layer 16 over the aluminum layer; an oxide hardmask 18 and a patterned photoresist layer 20 thereover. After etching in accordance with the process of the invention, aluminum lines are formed on the substrate wherein the copper-containing aluminum lines have vertical or slightly tapered sidewalls without leaving a copper residue on the substrate, as shown in FIG. 3B, wherein like layers have like numerals.

When a silicon oxide hardmask is employed. it can be patterned and etched in an oxide etch chamber using a precursor gas mixture of $CF_4$, $CHF_3$, and argon in known manner.

The substrates are then transferred to an aluminum etch chamber where the aluminum layers and optional TiN, TiW or W layers are etched in accordance with the invention.

After the aluminum lines have been formed, the substrate having a masking material or photoresist thereon is transferred to a strip chamber and stripped using a conventional three step strip comprising an optional ten second $CF_4/O_2/N_2$ initiation step, an optional ten second stabilization step and a 90 second $O_2/NH_3$ strip step. This strip process removes chlorine and photoresist from the aluminum lines to provide corrosion resistance during subsequent processing.

The invention will be further described in the following examples but the invention is not meant to be limited to the details described therein.

In the Examples, a first hard mask silicon oxide etch was performed in a separate etch chamber using as the etch precursor gas a mixture of 75 sccm of argon, 25 sccm of $CHF_3$ and 5 sccm of $CF_4$ at a pressure of 150 millitorr, 650 watts of power, a cathode temperature of 18° C., and anode temperature of 65° C. for about 64 seconds.

Comparative Example

A film stack as in FIG. 3 was etched under the following conditions using the conventional aluminum etch process for aluminum having low copper content but for aluminum containing 2% of copper. After an indication of end point was noted, the etch was continued for sixty seconds, denoted "oe" or overetch.

| COMPARATIVE EXAMPLE | | | |
|---|---|---|---|
|  | TiN | $Al_{ep}$ | $Al_{oe}$ |
| $BCl_3$, sccm | 30 | 50 | 30 |
| $Cl_2$, sccm | 10 | 40 | 10 |
| $N_2$, sccm | 15 | 15 | 15 |
| Pressure, mT | 30 | 150 | 40 |
| Temperature, °C. | 100 | 100 | 70 |
| Power, Watts | 400 | 425 | 250 |
| B field, gauss | — | 60 | 40 |

*overetch

Figure 2:
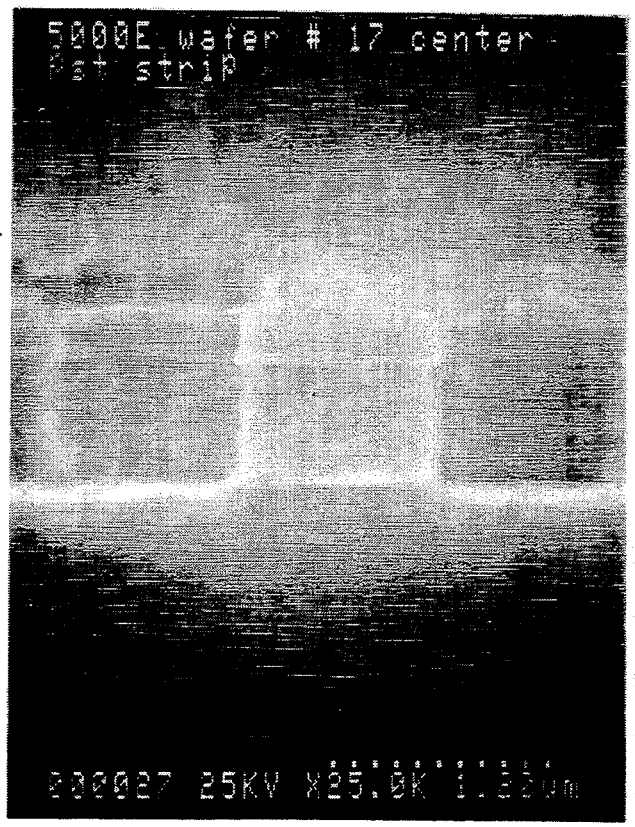
FIG. 2 is a photomicrograph of a cross section of an etched high copper content aluminum line using the prior art etching process.

Under these high pressure, high temperature conditions, and using nitrogen, a large amount of copper residue was seen on the surface of the substrate, as can be seen in FIGS. 1 and 2.

EXAMPLES 1 and 2

The following Table summarizes etch conditions used to etch aluminum containing 1% of copper (Example 1) and aluminum containing 2% of copper (Example 2) in accordance with the preferred processes of the invention for an aluminum stack.

TABLE

|  | Example 1 | | | | Example 2 | | |
|---|---|---|---|---|---|---|---|
|  | TiN | $Al_{70\%}$* | $Al_{ep}$ | $Al_{oe}$ | TiN | $Al_{ep}$ | $Al_{oe}$ |
| $BCl_3$ | 30 | 50 | 50 | 30 | 30 | 30 | 25 |
| $Cl_2$ | 10 | 40 | 25 | 10 | 10 | 25 | 15 |
| $N_2$ | 15 | 15 | 15 | 15 | 15 | 20 | 0 |
| Pressure, millitorr | 30 | 100 | 20 | 20 | 30 | 150 | 12 |
| Power, Watts | 400 | 500 | 350 | 250 | 400 | 500 | 425 |
| Temp, °C. | 90 | 90 | 90 | 90 | 65 | 65 | 65 |
| B field, 0 gauss |  | 80 | 40 | — | — | 80 | — |
| Time, seconds |  | 40 | 77 | 60 | 30 | 77 | 150 |

*About 70% of the aluminum film was etched first, the etch conditions changed as indicated and etching continued to the end point; overetch was continued for 60 seconds.

Figure 4:
FIG. 4 is a photomicrograph of etched high copper content aluminum lines using the process of the present invention.
Figure 5:
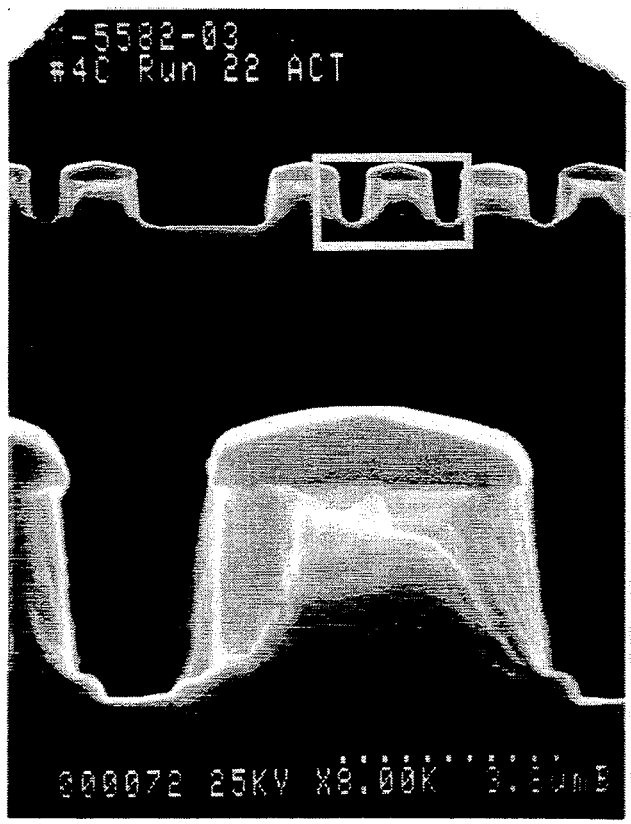
FIG. 5 is a photomicrograph of a cross section of an etched high copper content aluminum line using the process of the present invention.

The aluminum alloy etch rate was about 4000-7000 angstroms/minute. The photomicrographs of FIGS. 4 and 5 illustrate the excellent, copper free surface obtained from Example 2. A slight overetch into the underlying substrate can also be seen.

Thus reducing the amount of nitrogen in the precursor gas, and reducing the temperature and pressure while maintaining high power during the second stage etch greatly reduced the amount of copper residue on the surface of the substrate. However, this result may need to be balanced with improved sidewall profile control which can be obtained with the use of some nitrogen, which it is believed causes deposition of a polymer-type material of C—N, CN$^-$, B—N or BN$^-$ onto the sidewalls that protects them from isotropic etching. The sidewall profile is also dependent on the cathode temperature; the lower the temperature, the more vertical the sidewall.

The most dramatic effects on residue are a reduction of the nitrogen in the etch gas when etching the high copper concentration aluminum, a reduction in pressure when etching the high copper concentration aluminum, and a lesser effect due to a reduction in temperature. The profile is affected by a reduction in the temperature, a reduction in nitrogen levels in the second etch stage and a reduction in the pressure during etching.

Thus by keeping the temperature and pressure low during etching, improved profile control is achieved. By reducing the nitrogen gas levels and pressure, the amount of copper residue is reduced.

Although the above description is set forth using certain embodiments, various changes can be made in the materials and the equipment used as will be known to those skilled in the art. Thus such variations are meant to be included herein and the invention is only to be limited to the scope of the following claims.

I claim:

1. A method for reactive ion etching of an aluminum alloy containing over about 0.5% of copper on a substrate which comprises etching with a precursor gas including boron trichloride and chlorine at temperatures below about 80° C. while regulating the nitrogen content of the precursor gases to prevent formation of a copper residue on the substrate.

2. A method according to claim 1 wherein the temperature is maintained at about 60°-65° C. during etching.

3. A method according to claim 1 wherein said aluminum alloy has a layer selected from the group consisting of TiN, TiW and W thereover or thereunder.

4. A method according to claim 3 wherein said aluminum alloy has a layer of TiN thereover.

5. A method according to claim 1 wherein the pressure during etching is maintained at a level of about 10 to about 30 millitorr.

6. A method of reactive ion etching an aluminum layer containing about 1% by weight of copper on a substrate using boron trichloride and chlorine as the etch gases at a maximum temperature of about 100° C. comprising regulating the amount of nitrogen carrier gas during etching so that formation of a copper residue on the substrate is avoided.

7. A method according to claim 6 wherein the aluminum has a layer of TiN thereover.

8. A method of reactive ion etching an aluminum layer containing about 2% by weight of copper on a substrate using boron trichloride and chlorine as the etch gases at a maximum temperature of about 100° C. comprising etching by regulating the amount of nitrogen present so that formation of a copper residue on the substrate is avoided.

9. A method according to claim 8 wherein the aluminum has a layer of TiN thereover.

* * * * *